US008946057B2

(12) United States Patent
Lei et al.

(10) Patent No.: US 8,946,057 B2
(45) Date of Patent: Feb. 3, 2015

(54) LASER AND PLASMA ETCH WAFER DICING USING UV-CURABLE ADHESIVE FILM

(71) Applicant: Applied Materials, Inc., Santa Clara, CA (US)

(72) Inventors: Wei-Sheng Lei, San Jose, CA (US); Mohammad K. Chowdhury, Santa Clara, CA (US); Todd Egan, Fremont, CA (US); Brad Eaton, Menlo Park, CA (US); Madhava Rao Yalamanchili, Morgan Hill, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 15 days.

(21) Appl. No.: 13/847,964

(22) Filed: Mar. 20, 2013

(65) Prior Publication Data

US 2013/0280890 A1    Oct. 24, 2013

Related U.S. Application Data

(60) Provisional application No. 61/637,506, filed on Apr. 24, 2012, provisional application No. 61/663,397, filed on Jun. 22, 2012.

(51) Int. Cl.
*H01L 21/00* (2006.01)
*H01L 21/78* (2006.01)
*H01L 21/67* (2006.01)

(52) U.S. Cl.
CPC .......... *H01L 21/78* (2013.01); *H01L 21/67069* (2013.01); *H01L 21/67207* (2013.01)
USPC .......................................... 438/463; 438/462

(58) Field of Classification Search
USPC .................................................. 438/462, 463
See application file for complete search history.

(56) References Cited

U.S. PATENT DOCUMENTS

| 4,049,944 A | 9/1977 | Garvin et al. |
| 4,339,528 A | 7/1982 | Goldman |

(Continued)

FOREIGN PATENT DOCUMENTS

| JP | 9216085 | 8/1997 |
| JP | 10321908 | 12/1998 |

(Continued)

OTHER PUBLICATIONS

International Search Report and Written Opinion for PCT Patent Application No. PCT/US2013/036657 mailed Jul. 1, 2013, 11 pgs.

(Continued)

*Primary Examiner* — Bradley K Smith
(74) *Attorney, Agent, or Firm* — Blakely Sokoloff Taylor Zafman LLP

(57) ABSTRACT

Laser and plasma etch wafer dicing using UV-curable adhesive films is described. In an example, a method includes forming a mask above the semiconductor wafer. The semiconductor wafer is coupled to a carrier substrate by a UV-curable adhesive film. The mask covers and protects the integrated circuits. The mask is patterned with a laser scribing process to provide a patterned mask with gaps. The patterning exposes regions of the semiconductor wafer between the integrated circuits. The semiconductor wafer is then etched through the gaps in the patterned mask to form singulated integrated circuits. The UV-curable adhesive film is then irradiated with ultra-violet (UV) light. The singulated integrated circuits are then detached from the carrier substrate.

29 Claims, 9 Drawing Sheets

(56) References Cited

U.S. PATENT DOCUMENTS

| | | |
|---|---|---|
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,969,669 B2 | 11/2005 | Arita |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2009/0255911 A1 | 10/2009 | Krishnaswami et al. |
| 2010/0013036 A1 | 1/2010 | Carey |
| 2010/0015782 A1 | 1/2010 | Yu et al. |
| 2010/0173474 A1* | 7/2010 | Arita et al. .................... 438/462 |
| 2010/0246152 A1* | 9/2010 | Lin et al. ........................ 361/783 |
| 2010/0248451 A1 | 9/2010 | Pirogovsky et al. |
| 2011/0312157 A1 | 12/2011 | Lei et al. |
| 2012/0032240 A1* | 2/2012 | Mayuzumi .................... 257/288 |
| 2013/0045554 A1 | 2/2013 | Yamazaki |
| 2013/0065378 A1 | 3/2013 | Johnson et al. |
| 2013/0230972 A1 | 9/2013 | Johnson et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| KR | 100878408 | 1/2009 |
| WO | WO-03036712 | 5/2003 |
| WO | WO-03071591 | 5/2003 |

OTHER PUBLICATIONS

Linder, V. et al., "Water-Soluble Sacrificial Layers for Surface Micromachining", www.small-journal.com, 2005, 1, No. 7, 7 Pages.

Singh, Saravjeet et al., "Apparatus and Methods for Dry Etch With Edge, Side and Back Protection", U.S. Appl. No. 61/491,693, filed May 31, 2011 24 pgs.

* cited by examiner

LASER AND PLASMA ETCH WAFER DICING USING UV-CURABLE ADHESIVE FILM

CROSS-REFERENCE TO RELATED APPLICATIONS

This application claims the benefit of U.S. Provisional Application No. 61/637,506, filed Apr. 24, 2012, and U.S. Provisional Application No. 61/663,397, filed Jun. 22, 2012, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention are directed to laser and plasma etch wafer dicing using UV-curable adhesive films.

In an embodiment, a method includes forming a mask above the semiconductor wafer. The semiconductor wafer is coupled to a carrier substrate by a UV-curable adhesive film. The mask covers and protects the integrated circuits. The mask is patterned with a laser scribing process to provide a patterned mask with gaps. The patterning exposes regions of the semiconductor wafer between the integrated circuits. The semiconductor wafer is then etched through the gaps in the patterned mask to form singulated integrated circuits. The UV-curable adhesive film is then irradiated with ultra-violet (UV) light. The singulated integrated circuits are then detached from the carrier substrate.

In an embodiment, a system for dicing a semiconductor wafer having a plurality of integrated circuits includes a factory interface. A laser scribe apparatus is coupled with the factory interface. A plasma etch chamber is coupled with the factory interface. An ultra-violet (UV) irradiation station is coupled with the factory interface. The UV irradiation station is configured to weaken a UV-curable adhesive film.

In an embodiment, a method of dicing a semiconductor wafer having a plurality of integrated circuits includes forming a mask above a silicon substrate coupled to a carrier substrate by a UV-curable adhesive film. The mask covers and protects integrated circuits disposed on the silicon substrate. The integrated circuits include a layer of silicon dioxide disposed above a layer of low K material and a layer of copper. The method further includes patterning the mask, the layer of silicon dioxide, the layer of low K material, and the layer of copper with a laser scribing process to expose regions of the silicon substrate between the integrated circuits. The silicon substrate is then etched through the exposed regions to form singulated integrated circuits. The UV-curable adhesive film is irradiated with ultra-violet (UV) light. The method also includes detaching the singulated integrated circuits from the carrier substrate.

DETAILED DESCRIPTION

Figure 1:
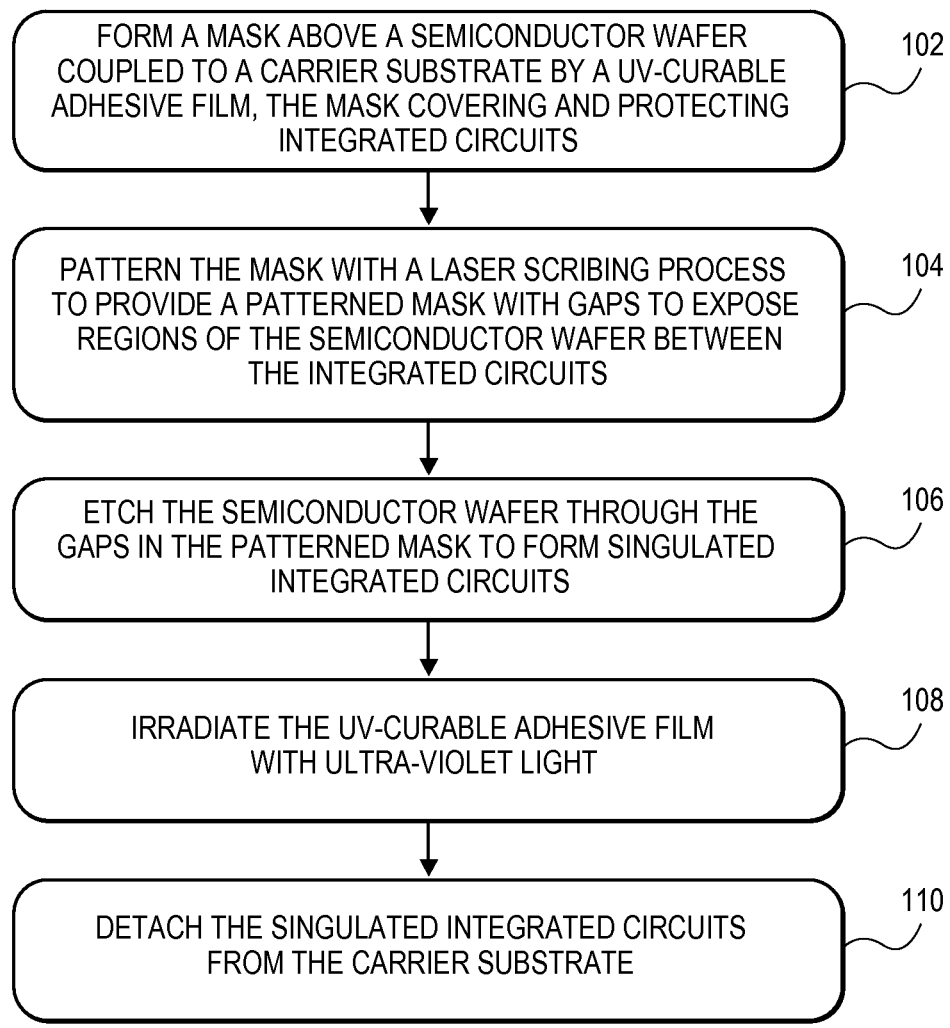
FIG. 1 is a Flowchart representing operations in a method of dicing a semiconductor wafer including a plurality of integrated circuits, in accordance with an embodiment of the present invention.

Methods of dicing semiconductor wafers, each wafer having a plurality of integrated circuits thereon, are described. In the following description, numerous specific details are set forth, such as laser and plasma etch wafer dicing approaches using UV-curable adhesive films, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

In a hybrid wafer or substrate dicing process, a wafer is specifically handled for both dicing and separated die harvest. The wafer to be diced typically should be kept on a carrier such as a dicing tape or a carrier wafer. The carrier should ensure the cleanliness of separated dies for subsequent die pick. For example, a device wafer may be mounted on the dicing tape. The wafer together with the tape and frame is subjected to a plasma etching process. However, such an approach may put specific requirements on the dicing tape to be used.

One or more embodiments of the present invention include the use of a glass wafer as a carrier wafer. A device wafer is mounted on a dicing tape and then onto the glass wafer. As such, a tape frame is not involved in the plasma etching phase.

Following the etching, the device side of the wafer is mounted onto a dicing tape for protection. Subsequently, the glass carrier wafer and the backside dicing tape are removed and the wafer is mounted onto dicing tape with a frame. A front protective tape is then removed. Accordingly, individual dies may be picked for subsequent packaging and assembly operations.

Advantages of the above approach including use of a transparent or glass wafer may include, but are not limited to, one or more of (1) the ability to bypass use of a tape frame inside a plasma chamber. This may avoiding concerns regarding potential degradation of dicing tape during plasma etching and any accompanying changes of chamber configuration to adapt large sized tape frame. (2) Currently used wafer loading and unloading apparatuses for plasma operations may still be used including the wafer storage cassette, robot, or transportation hardware. (3) Both dicing tapes and protective tapes may use UV-curable materials so that they may be readily detached with UV curing. In an embodiment, a suitable wafer thickness for the above approach is approximately 120 microns or thicker.

For IC memory chips, as memory capacity increases, multichip functions and continuous packaging miniaturization may require ultra thin wafer dicing. For logic device chips/processsors, major challenges lie in IC performance increase, low k materials and other material adoption. Wafer thickness reduction in such cases may not be a major driver and, typically, wafer thicknesses in the range of approximately 100 microns to 760 microns are used for major applications to ensure sufficient chip integrity. Processor chip designers/chip makers may place test element groups (TEGs or test patterns) as well as alignment patterns in wafer streets. On one hand, such test patterns may be completely removed during a chip singulation process. On the other hand, the complexity of the test patterns may dictate that the dimensions of the test patterns remain relatively large, typically in the 50 micron to 100 micron range perpendicular to the wafer street. A kerf width approximately in the range of 50 microns to 100 microns, at least at the top surface of the wafer, may thus be needed to completely remove the test patterns. As such, for logic device wafer singulation, a major focus is to achieve delamination-free and efficient dicing processes.

For diamond saw cutting based pure mechanical approach, when applied to low k wafer dicing, even with drastic speed reductions (e.g., down to 2 to 3 mm/sec from typically 40-100 mm/sec), chipping and delamination/crack formation due to mechanical stresses are typically unavoidable in most low-k wafer dicing. Pure laser ablation based dicing technology faces great challenges in throughput improvement, maintaining required die strength and side wall roughness, as well as reducing chances of delamination and chipouts when high power is used to address required throughput. Several hybrid technologies combine laser and the conventional dicing saw to address the low k wafers. First, a laser scribes through the top passivation and metal structures within the street, which the mechanical dicing saw has difficulties to cut through. Next, the saw is used to cut through the actual silicon (Si) substrate. Such a hybrid process may be very slow and typical mechanical sawing problems remain. For example, the wafer backside chipping inherent to the mechanical stress from diamond saw dicing still remains.

Furthermore, mitigation of laser induced front side chipping and delamination associated with low k dielectric stacks has been attempted. For example, a sealing ring has been placed surrounding each die to function as a barrier to propagation of interlayer dielectric and metal layers peeling/delamination. Also, copper grids of certain copper density (e.g., typically 20-80%) in the form of squares called dummies or tiling is added under the passivation layer in the streets wherever there is an absence of alignment or test patterns. Such approaches have aided in suppressing the delamination and chipping. For wafers of 100 microns or thicker, when being diced, the rigidity may be sufficient to directly place the wafers on mounting tapes without die attach film (DAF) such that no DAF cutting process is involved.

Embodiments described herein may address dicing applications of IC wafers, especially with processor chips that have a thickness approximately in the range of 100 microns to 800 microns, and more particularly approximately in the range of 100 microns to 600 microns thickness, and an acceptable dicing kerf width approximately in the range of 50 microns to 200 microns, and more particularly approximately in the range of 50 microns to 100 microns, measured on wafer front surface (e.g., corresponding typical kerf width measured from back side of wafer is approximately 30-50 microns in a laser/saw hybrid process). One or more embodiments are directed to a hybrid laser scribing plus plasma etching approach to dice wafers as described above.

Figure 2A:
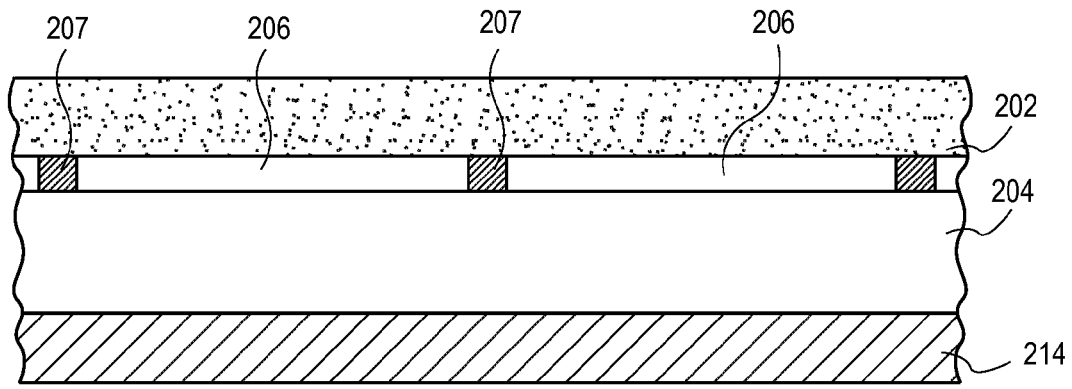
FIG. 2A illustrates a cross-sectional view of a semiconductor wafer including a plurality of integrated circuits during performing of a method of dicing the semiconductor wafer, corresponding to operation 102 of the Flowchart of FIG. 1, in accordance with an embodiment of the present invention.
Figure 2B:
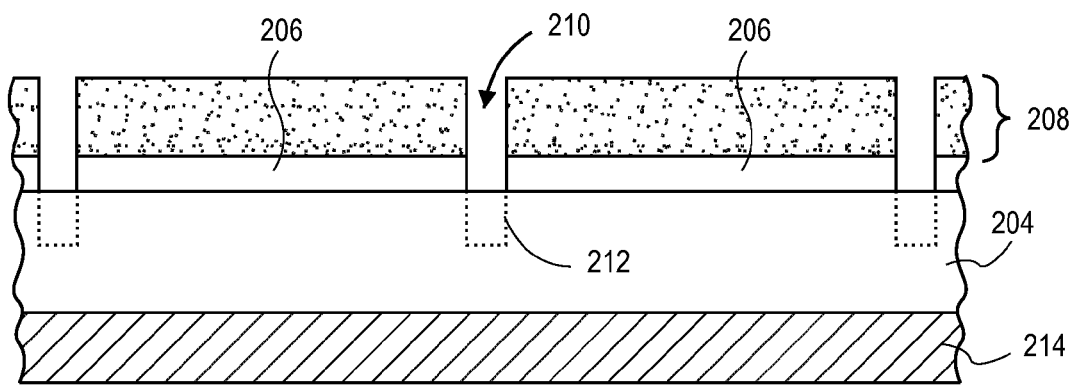
FIG. 2B illustrates a cross-sectional view of a semiconductor wafer including a plurality of integrated circuits during performing of a method of dicing the semiconductor wafer, corresponding to operation 104 of the Flowchart of FIG. 1, in accordance with an embodiment of the present invention.
Figure 2C:
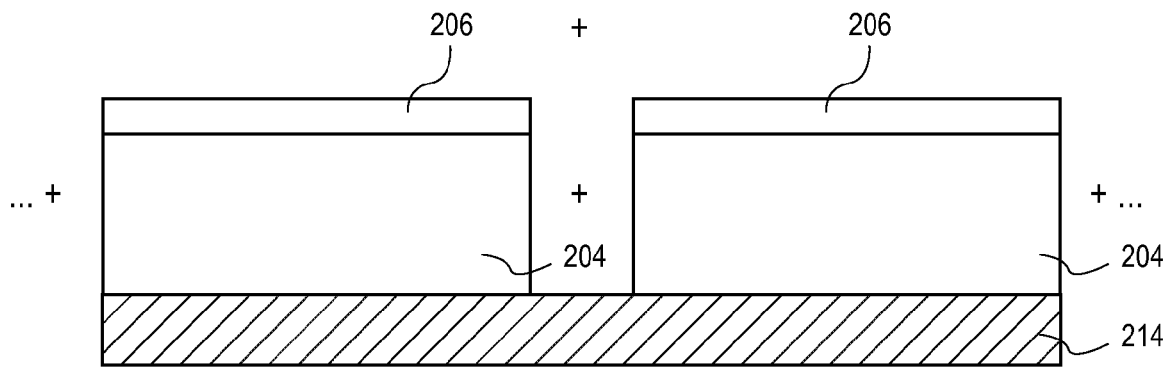
FIG. 2C illustrates a cross-sectional view of a semiconductor wafer including a plurality of integrated circuits during performing of a method of dicing the semiconductor wafer, corresponding to operations 106 and 108 of the Flowchart of FIG. 1, in accordance with an embodiment of the present invention.

FIG. 1 is a Flowchart 100 representing operations in a method of dicing a semiconductor wafer including a plurality of integrated circuits, in accordance with an embodiment of the present invention. FIGS. 2A-2C illustrate cross-sectional views of a semiconductor wafer including a plurality of integrated circuits during performing of a method of dicing the semiconductor wafer, corresponding to operations of Flowchart 100, in accordance with an embodiment of the present invention.

Referring to operation 102 of Flowchart 100, and corresponding FIG. 2A, a mask 202 is formed above a semiconductor wafer or substrate 204. The wafer or substrate 204 is disposed on a UV-curable adhesive film 214. The UV-curable adhesive film 214 may be further disposed on a substrate (not shown) such as a glass substrate, as described in greater detail below in association with FIGS. 4A-4K. The mask 202 covers and protects integrated circuits 206 formed on the surface of semiconductor wafer 204. The mask 202 also covers intervening streets 207 formed between each of the integrated circuits 206.

In accordance with an embodiment of the present invention, forming the mask 202 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In an embodiment, semiconductor wafer or substrate 204 is composed of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a material such as, e.g., a material substrate used in the fabrication of light emitting diodes (LEDs).

In an embodiment, semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Conductive bumps and/or passivation layers may be formed above the interconnects layers. Materials making up the streets 207 may be similar to or the same as those materials used to form the integrated circuits 206. For example, streets 207 may be composed of layers of dielectric materials, semiconductor materials, and metallization. In one embodiment, one or more of the streets 207 includes test devices similar to the actual devices of the integrated circuits 206.

Referring to operation 104 of Flowchart 100, and corresponding FIG. 2B, the mask 202 is patterned with a laser scribing process to provide a patterned mask 208 with gaps 210, exposing regions of the semiconductor wafer or substrate 204 between the integrated circuits 206. As such, the laser scribing process is used to remove the material of the streets 207 originally formed between the integrated circuits 206. In accordance with an embodiment of the present invention, patterning the mask 202 with the laser scribing process includes forming trenches 212 partially into the regions of the semiconductor wafer 204 between the integrated circuits 206, as depicted in FIG. 2B.

In an embodiment, patterning the mask 202 with the laser scribing process includes using a laser having a pulse width in the femtosecond range. Specifically, a laser with a wavelength in the visible spectrum or the ultra-violet (UV) or infra-red (IR) ranges (the three totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 202, the streets 207 and, possibly, a portion of the semiconductor wafer or substrate 204.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 3 illustrates a cross-sectional view of a stack of materials that may be used in a street region of a semiconductor wafer or substrate, in accordance with an embodiment of the present invention.

Figure 3:
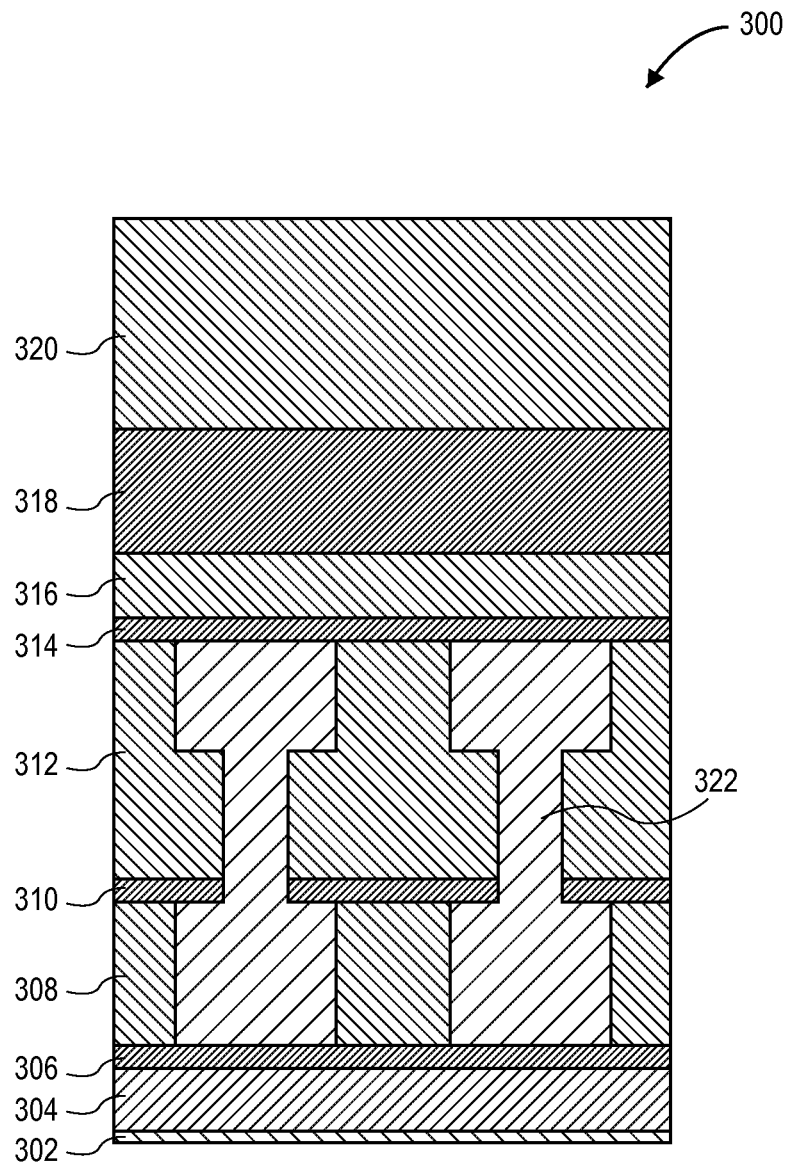
FIG. 3 illustrates a cross-sectional view of a stack of materials that may be used in a street region of a semiconductor wafer or substrate, in accordance with an embodiment of the present invention.

Referring to FIG. 3, a street region 300 includes the top portion 302 of a silicon substrate, a first silicon dioxide layer 304, a first etch stop layer 306, a first low K dielectric layer 308 (e.g., having a dielectric constant of less than the dielectric constant of 4.0 for silicon dioxide), a second etch stop layer 310, a second low K dielectric layer 312, a third etch stop layer 314, an undoped silica glass (USG) layer 316, a second silicon dioxide layer 318, and a layer of photo-resist 320, with relative thicknesses depicted. Copper metallization 322 is disposed between the first and third etch stop layers 306 and 314 and through the second etch stop layer 310. In a specific embodiment, the first, second and third etch stop layers 306, 310 and 314 are composed of silicon nitride, while low K dielectric layers 308 and 312 are composed of a carbon-doped silicon oxide material.

Under conventional laser irradiation (such as nanosecond-based or picosecond-based laser irradiation), the materials of street 300 may behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to operation 106 of Flowchart 100, and corresponding FIG. 2C, the semiconductor wafer 204 is etched through the gaps 210 in the patterned mask 208 to form singulated integrated circuits 206. In accordance with an embodiment of the present invention, etching the semiconductor wafer 204 includes etching the trenches 212 formed with the laser scribing process to ultimately etch entirely through semiconductor wafer 204, as depicted in FIG. 2C.

In an embodiment, etching the semiconductor wafer 204 includes using a plasma etching process. In one embodiment, a through-silicon via type etch process is used. For example, in a specific embodiment, the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 204 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally is a fluorine-based gas such as $SF_6$, $C_4F_8$, $CHF_3$, $XeF_2$, or any other reactant gas capable of etching silicon at a relatively fast etch rate.

Referring again to FIG. 2C, the singulated integrated circuits 206 remain coupled to the UV-curable adhesive film 214. Referring to operation 108 of Flowchart 100, and described in greater detail below in association with FIGS. 4A-4K, the UV-curable adhesive film 214 is irradiated with UV light to weaken the adhesive properties of the UV-curable adhesive film 214. Then, referring to operation 110 of Flowchart 100, and again described in greater detail below in association with FIGS. 4A-4K, the singulated integrated circuits 206 are detached from the UV-curable adhesive film 214. In an embodiment, the patterned mask 208 is removed after the laser scribe and plasma etch portions of the singulation process, as is also depicted in FIG. 2C. However, the patterned mask 208 may be removed prior to, during, or following UV irradiation of the UV-curable adhesive film 214, as described in more detail below in association with FIGS. 4A-4K.

Accordingly, referring again to Flowchart 100 and FIGS. 2A-2C, wafer dicing may be preformed by initial laser ablation through a mask, through wafer streets (including metallization), and partially into a silicon substrate. The laser pulse width may be selected in the femtosecond range. Die singulation may then be completed by subsequent through-silicon deep plasma etching. Furthermore, weakening of UV-curable adhesive film 214 by UV light exposure is performed to provide singulated integrated circuits. A specific example of a materials stack for dicing is described below in association with FIGS. 4A-4K, in accordance with an embodiment of the present invention.

Figure 4A:
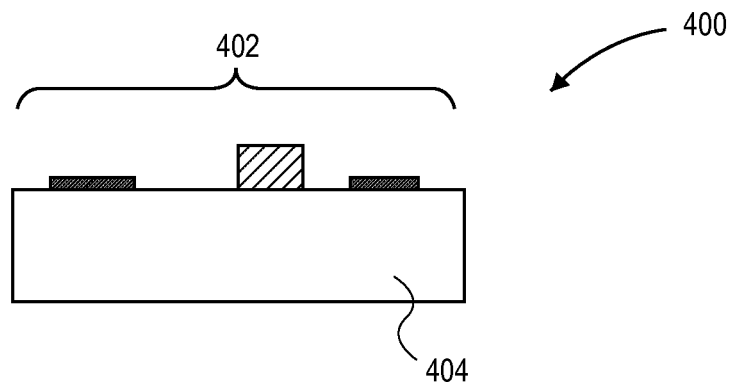
FIGS. 4A-4K illustrate cross-sectional views of various operations in a method of dicing a semiconductor wafer, in accordance with an embodiment of the present invention.
Figure 4B:
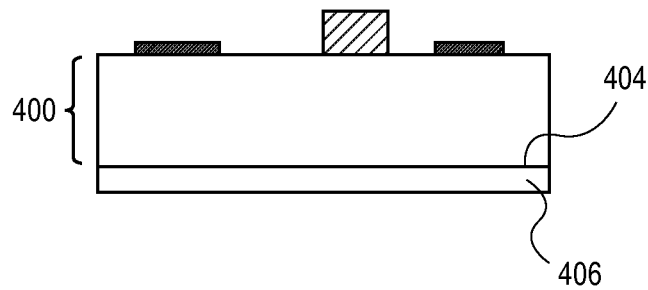
Figure 4C:
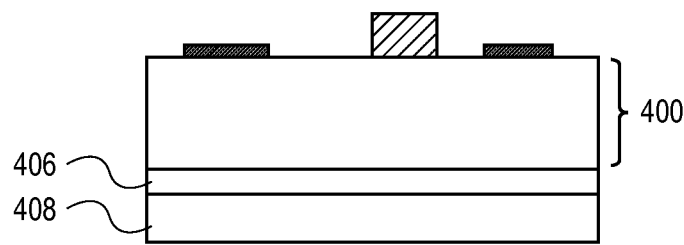

Referring to FIG. 4A, a method of wafer handling for laser scribing and plasma etch includes providing a device wafer 400 having an active side 402 and a back side 404. The device wafer 400 is mounted on a UV-curable adhesive film 406 via the back side 404, as depicted in FIG. 4B. Referring to FIG. 4C, the device wafer 400 is then mounted on a carrier substrate 408 via the UV-curable adhesive film 406.

In an embodiment, the UV-curable adhesive film is a double-sided tape including a carrier film disposed between two adhesive layers. In one such embodiment, the carrier film is composed of polyvinyl chloride and the two adhesive layers are acrylic-based adhesive layers. In an embodiment, the UV-curable adhesive film is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

Figure 4D:
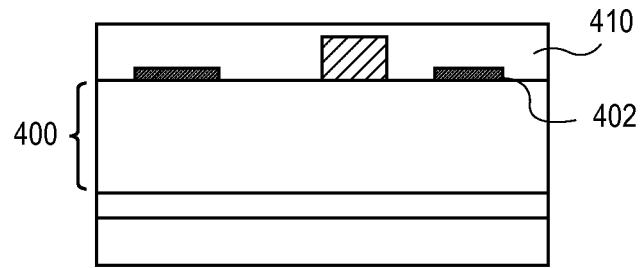
Figure 4E:
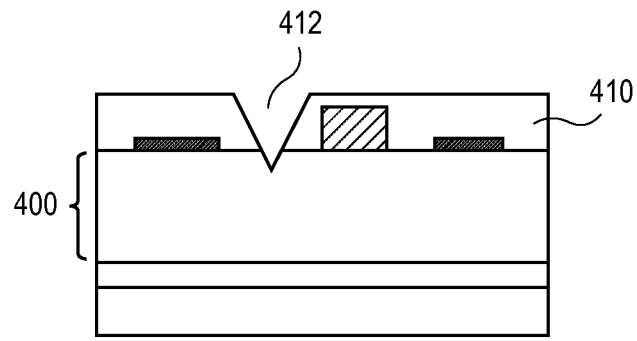
Figure 4F:
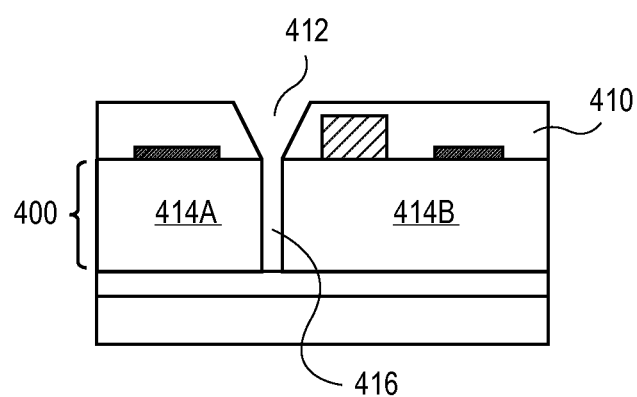

Referring to FIG. 4D, a mask 410 is disposed on the active side 402 of the device wafer 400, e.g., by spin coating a resist or other material on the active side 402. The mask 410 and a portion of the device wafer 400 are then patterned by a laser scribing process to provide a scribe line 412 exposing portions of the device wafer 400, as depicted in FIG. 4E. Referring to FIG. 4F, with the mask 410 in place, portions of the device wafer 400 exposed by scribe line 412 are then etched through to the UV-curable adhesive film 406 by a plasma etching process. Individualized portions 414 (e.g., 414A and 414B) of the device wafer 400 are separated by gaps 416, as is also depicted in FIG. 4F.

Figure 4G:
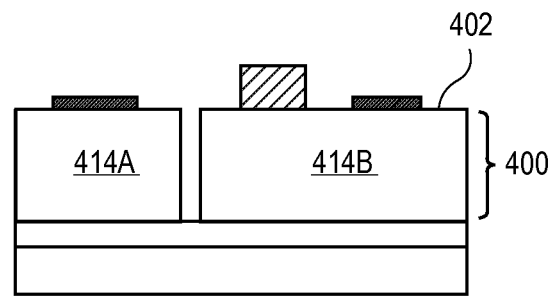
Figure 4H:
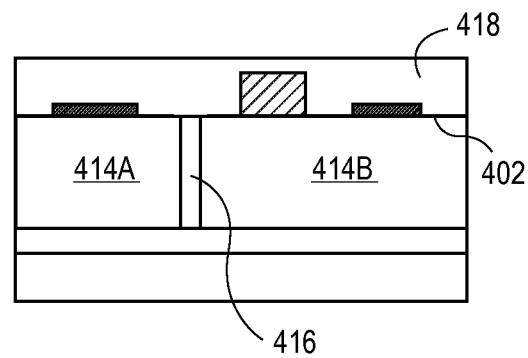
Figure 4I:
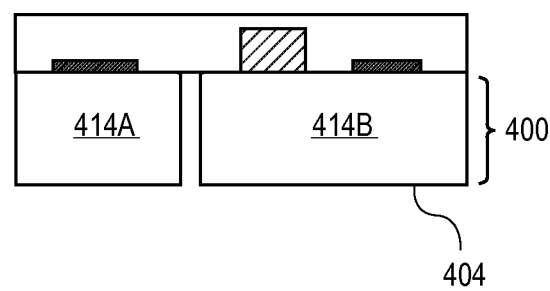
Figure 4J:
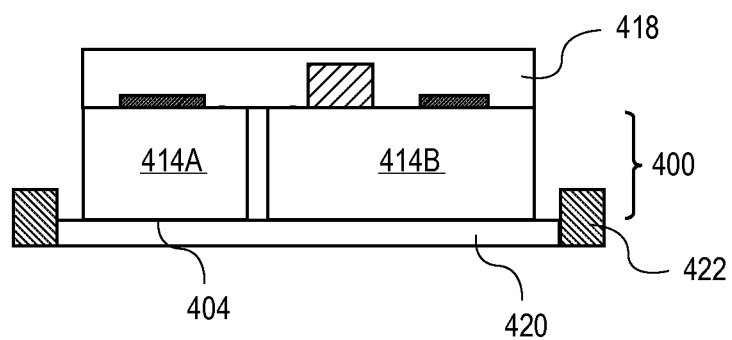
Figure 4K:
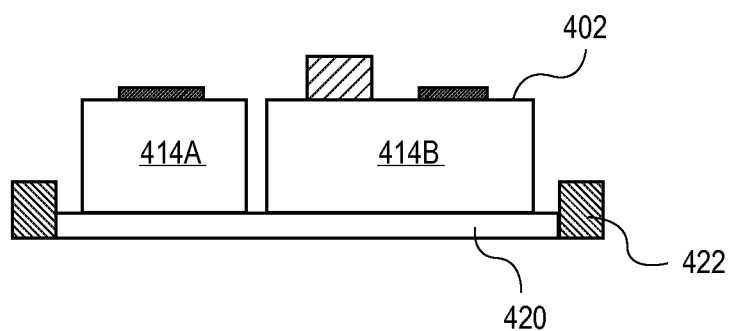

Referring to FIG. 4G, the mask 410 is removed to expose the active side 402 of now individualized portions 414A and 414B of device wafer 400. A protective layer 418, e.g., a protective tape, is then applied to the active side 402, including over gap 416, as depicted in FIG. 4H. Referring to FIG. 4I, the UV-curable adhesive film 406 and the carrier substrate 408 are removed to expose the back side 404 of now individualized portions 414A and 414B of device wafer 400.

In an embodiment, irradiating the UV-curable adhesive film with UV light includes reducing an adhesiveness of the UV-curable adhesive film by at least approximately 90%. In an embodiment, the carrier substrate 408 is transparent to UV light. Irradiating the UV-curable adhesive film with UV light includes irradiating through the carrier substrate to the UV-curable adhesive film. In one such embodiment, the transparent substrate is a glass substrate.

Referring to FIG. 4I, the individualized portions 414A and 414B of device wafer 400 are attached to a tape layer 420 of a dicing frame 422 via back side 404. Then, referring to FIG. 4K, protective layer 418 (depicted in FIG. 4J) is removed to expose the active side 402 of individualized portions 414A and 414B, e.g., which may now be individualized die supported by tape layer 420 of dicing frame 422. In an embodiment, the protective layer 418 is also UV-curable and may be removed or weakened in a same or different UV irradiation operation as used for irradiating the UV-curable adhesive film 406. At this stage, individual die are available for individual selection or picking from the tape layer 420 of dicing frame 422. In an embodiment, the singulated integrated circuits are removed from the tape layer 420 for packaging.

Thus, in accordance with an embodiment of the present invention, a UV-curable adhesive film is applied to a device wafer for singulation. The UV-curable adhesive film attach film is applied onto a carrier tape or carrier wafer. After the laser scribing and subsequent silicon etch processes, the dies are singulated while portions of the UV-curable adhesive film along the wafer streets are exposed. The singulated device wafer is then, in one embodiment, released from the UV-curable adhesive film upon irradiation of the UV-curable adhesive film with UV light.

Referring again to FIGS. 2A-2C, the plurality of integrated circuits 206 may be separated by streets 207 having a width of approximately 10 microns or smaller. The use of a femtosecond-based laser scribing approach, at least in part due to the tight profile control of the laser, may enable such compaction in a layout of integrated circuits. It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits. In an embodiment, the plurality of integrated circuits 206 may be arranged on semiconductor wafer or substrate 204 in a non-restricted or freeform layout.

A single process tool may be configured to perform many or all of the operations in a hybrid laser ablation and plasma etch singulation process including the use of a UV-curable adhesive film. For example, FIG. 5 illustrates a block diagram of a tool layout for laser and plasma dicing of wafers or substrates, in accordance with an embodiment of the present invention.

Figure 5:
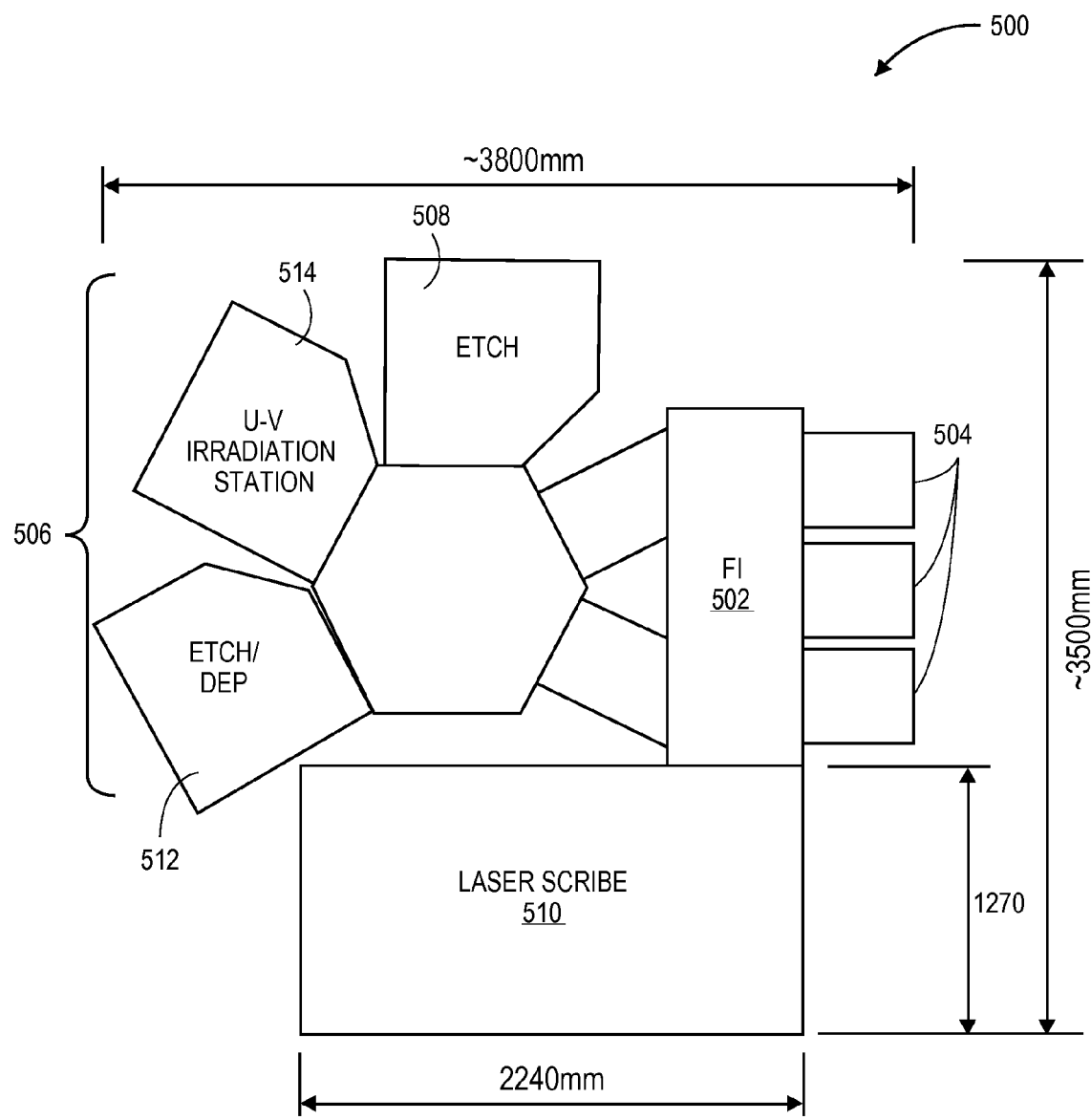
FIG. 5 illustrates a block diagram of a tool layout for laser and plasma dicing of wafers or substrates, in accordance with an embodiment of the present invention.

Referring to FIG. 5, a process tool 500 includes a factory interface 502 (FI) having a plurality of load locks 504 coupled therewith. A cluster tool 506 is coupled with the factory interface 502. The cluster tool 506 includes a plasma etch chamber 508. A laser scribe apparatus 510 is also coupled to the factory interface 502. The overall footprint of the process tool 500 may be, in one embodiment, approximately 3500 millimeters (3.5 meters) by approximately 3800 millimeters (3.8 meters), as depicted in FIG. 5.

In an embodiment, the laser scribe apparatus 510 houses a laser. In one such embodiment, the laser is a femtosecond-based laser. The laser is suitable for performing a laser ablation portion of a hybrid laser and etch singulation process including the use of a mask, such as the laser ablation processes described above. In one embodiment, a moveable stage is also included in laser scribe apparatus 500, the moveable stage configured for moving a wafer or substrate (or a carrier thereof) relative to the laser. In a specific embodiment, the laser is also moveable. The overall footprint of the laser scribe apparatus 1210 may be, in one embodiment, approximately 2240 millimeters by approximately 1270 millimeters, as depicted in FIG. 5.

In an embodiment, the plasma etch chamber 508 is configured for etching a wafer or substrate through the gaps in a patterned mask to singulate a plurality of integrated circuits. In one such embodiment, the plasma etch chamber 508 is configured to perform a deep silicon etch process. In a specific embodiment, the plasma etch chamber 508 is an Applied Centura® Silvia™ Etch system, available from Applied Materials of Sunnyvale, Calif., USA. The plasma etch chamber 508 may be specifically designed for a deep silicon etch used to create singulate integrated circuits housed on or in single crystalline silicon substrates or wafers. In an embodiment, a high-density plasma source is included in the plasma etch chamber 508 to facilitate high silicon etch rates. In an embodiment, more than one plasma etch chamber is included in the cluster tool 506 portion of process tool 500 to enable high manufacturing throughput of the singulation or dicing process.

The factory interface 502 may be a suitable atmospheric port to interface between an outside manufacturing facility with laser scribe apparatus 510 and cluster tool 506. The factory interface 502 may include robots with arms or blades for transferring wafers (or carriers thereof) from storage units (such as front opening unified pods) into either cluster tool 506 or laser scribe apparatus 510, or both.

Cluster tool 506 may include other chambers suitable for performing functions in a method of singulation. For example, in one embodiment, in place of an additional etch chamber, a deposition chamber 512 is included. The deposition chamber 512 may be configured for mask deposition on or above a device layer of a wafer or substrate prior to laser scribing of the wafer or substrate. In one such embodiment, the deposition chamber 512 is suitable for depositing a photo-resist layer.

In an embodiment, an ultra-violet (UV) irradiation station 514, e.g., including a UV light source, is included for weakening a UV-curable adhesive film. In one such embodiment, the UV irradiation station is configured to reduce an adhesiveness of the UV-curable adhesive film by at least approximately 90%. In an embodiment, a metrology station is also included as a component of process tool 500.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1200 described in association with FIG. 5. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
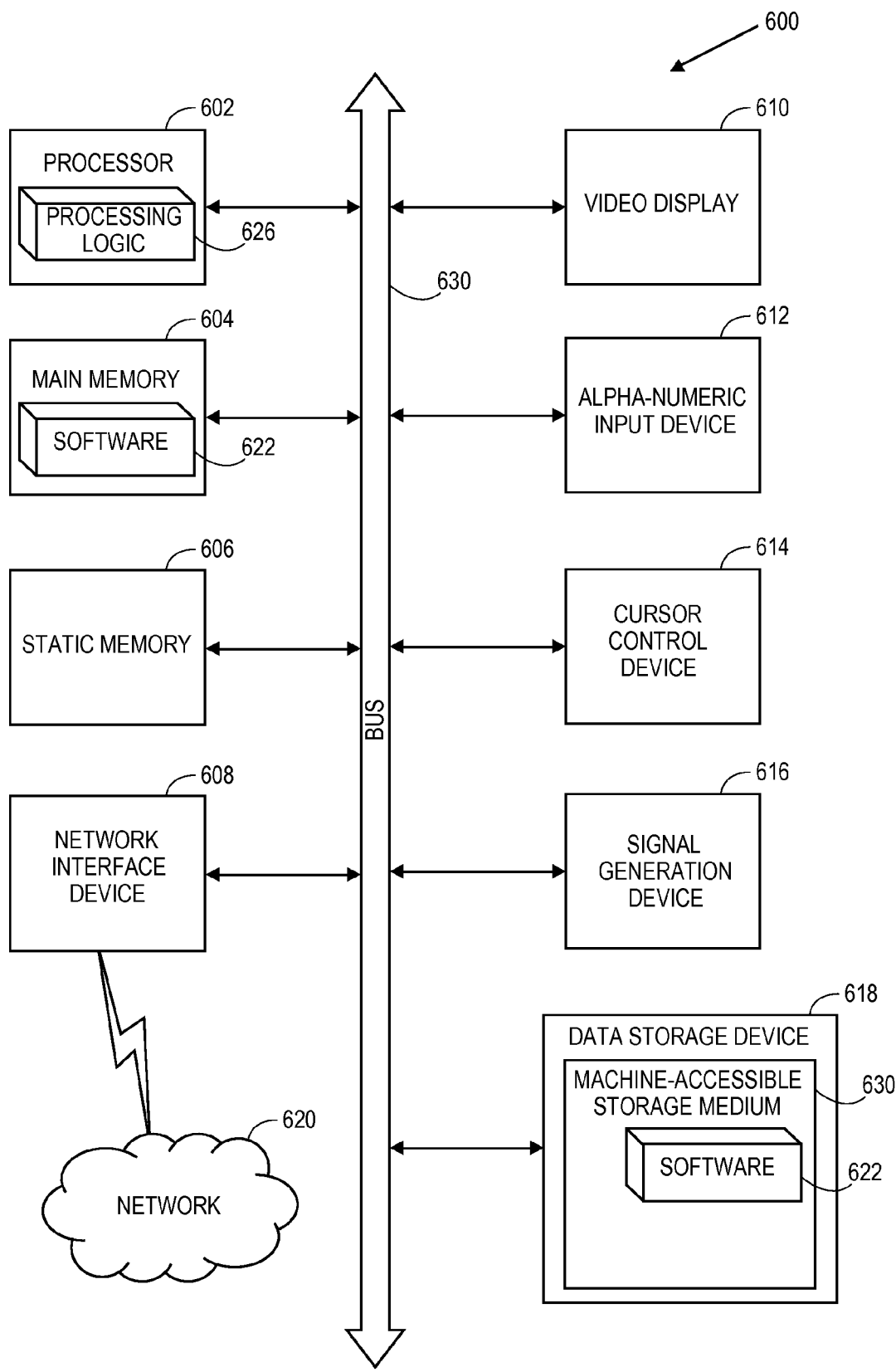
FIG. 6 illustrates a block diagram of an exemplary computer system, in accordance with an embodiment of the present invention.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method includes forming a mask above the semiconductor wafer. The semiconductor wafer is coupled to a carrier substrate by a UV-curable adhesive film. The mask covers and protects the integrated circuits. The mask is patterned with a laser scribing process to provide a patterned mask with gaps. The patterning exposes regions of the semiconductor wafer between the integrated circuits. The semiconductor wafer is then etched through the gaps in the patterned mask to form singulated integrated circuits. The UV-curable adhesive film is then irradiated with ultra-violet (UV) light. The singulated integrated circuits are then detached from the carrier substrate.

Thus, laser and plasma etch wafer dicing using UV-curable adhesive films has been disclosed. In accordance with an embodiment of the present invention, a method includes forming a mask above the semiconductor wafer. The semiconductor wafer is coupled to a carrier substrate by a UV-curable adhesive film. The mask covers and protects the integrated circuits. The mask is patterned with a laser scribing process to provide a patterned mask with gaps. The patterning exposes regions of the semiconductor wafer between the integrated circuits. The semiconductor wafer is then etched through the gaps in the patterned mask to form singulated integrated circuits. The UV-curable adhesive film is then irradiated with ultra-violet (UV) light. The singulated integrated circuits are then detached from the carrier substrate. In one embodiment, irradiating the UV-curable adhesive film with UV light comprises reducing an adhesiveness of the UV-curable adhesive film by at least approximately 90%.

What is claimed is:

1. A method of dicing a semiconductor wafer comprising a plurality of integrated circuits, the method comprising:
    forming a mask above the semiconductor wafer coupled to a carrier substrate by a UV-curable adhesive film, the mask covering and protecting the integrated circuits;
    patterning the mask with a laser scribing process to provide a patterned mask with gaps, exposing regions of the semiconductor wafer between the integrated circuits;
    etching the semiconductor wafer through the gaps in the patterned mask to form singulated integrated circuits;
    subsequent to etching the semiconductor wafer, removing the mask;
    subsequent to removing the mask, irradiating the UV-curable adhesive film with ultra-violet (UV) light; and
    detaching the singulated integrated circuits from the carrier substrate.

2. The method of claim 1, wherein irradiating the UV-curable adhesive film with UV light comprises reducing an adhesiveness of the UV-curable adhesive film by at least approximately 90%.

3. The method of claim 1, wherein the carrier substrate is transparent to UV light and irradiating the UV-curable adhesive film with UV light comprises irradiating through the carrier substrate to the UV-curable adhesive film.

4. The method of claim 1, further comprising:
    subsequent to removing the mask and prior to irradiating the UV-curable adhesive film, applying a protective layer to the singulated integrated circuits.

5. The method of claim 1, wherein the UV-curable adhesive film is a double-sided tape comprising a carrier film disposed between two adhesive layers.

6. The method of claim 5, wherein the carrier film comprises polyvinyl chloride and the two adhesive layers are acrylic-based adhesive layers.

7. The method of claim 1, wherein the semiconductor wafer has a thickness approximately in the range of 100-600 microns.

8. The method of claim 1, wherein patterning the mask with the laser scribing process comprises patterning with a femtosecond-based laser scribing process, and wherein etching the semiconductor wafer through the gaps in the patterned mask comprises using a high density plasma etching process.

9. A system for dicing a semiconductor wafer comprising a plurality of integrated circuits, the system comprising:
    a factory interface;
    a laser scribe apparatus coupled with the factory interface;
    a plasma etch chamber coupled with the factory interface; and
    an ultra-violet (UV) irradiation station coupled with the factory interface, the UV irradiation station configured to weaken a UV-curable adhesive film.

10. The system of claim 9, wherein the UV irradiation station is configured to reduce an adhesiveness of the UV-curable adhesive film by at least approximately 90%.

11. A method of dicing a semiconductor wafer comprising a plurality of integrated circuits, the method comprising:
    forming a mask above a silicon substrate coupled to a carrier substrate by a UV-curable adhesive film, the mask covering and protecting integrated circuits disposed on the silicon substrate, the integrated circuits comprising a layer of silicon dioxide disposed above a layer of low K material and a layer of copper;
    patterning the mask, the layer of silicon dioxide, the layer of low K material, and the layer of copper with a laser scribing process to expose regions of the silicon substrate between the integrated circuits;
    etching the silicon substrate through the exposed regions to form singulated integrated circuits;
    subsequent to etching the silicon substrate, removing the mask;
    subsequent to removing the mask, irradiating the UV-curable adhesive film with ultra-violet (UV) light; and
    detaching the singulated integrated circuits from the carrier substrate.

12. The method of claim 11, wherein irradiating the UV-curable adhesive film with UV light comprises reducing an adhesiveness of the UV-curable adhesive film by at least approximately 90%.

13. The method of claim 11, wherein the carrier substrate is transparent to UV light and irradiating the UV-curable adhesive film with UV light comprises irradiating through the carrier substrate to the UV-curable adhesive film.

14. The method of claim 11, further comprising:
subsequent to removing the mask and prior to irradiating the UV-curable adhesive film, applying a protective layer to the singulated integrated circuits.

15. The method of claim 11, wherein the UV-curable adhesive film is a double-sided tape comprising a carrier film disposed between two adhesive layers.

16. The method of claim 15, wherein the carrier film comprises polyvinyl chloride and the two adhesive layers are acrylic-based adhesive layers.

17. The method of claim 11, wherein the silicon substrate has a thickness approximately in the range of 100-600 microns.

18. The method of claim 11, wherein patterning the mask, the layer of silicon dioxide, the layer of low K material, and the layer of copper with the laser scribing process comprises patterning with a femtosecond-based laser scribing process, and wherein etching the silicon substrate through the exposed regions comprises using a high density plasma etching process.

19. The method of claim 11, wherein patterning the mask, the layer of silicon dioxide, the layer of low K material, and the layer of copper with the laser scribing process comprises ablating the mask prior to ablating the layer of silicon dioxide, and ablating the layer of silicon dioxide prior to ablating the layer of low K material and the layer of copper.

20. A method of dicing a semiconductor wafer comprising a plurality of integrated circuits, the method comprising:
forming a mask above the semiconductor wafer coupled to a carrier substrate by a UV-curable adhesive film, the mask covering and protecting the integrated circuits, wherein the UV-curable adhesive film is a double-sided tape comprising a carrier film disposed between two adhesive layers;
patterning the mask with a laser scribing process to provide a patterned mask with gaps, exposing regions of the semiconductor wafer between the integrated circuits;
etching the semiconductor wafer through the gaps in the patterned mask to form singulated integrated circuits;
irradiating the UV-curable adhesive film with ultra-violet (UV) light; and
detaching the singulated integrated circuits from the carrier substrate.

21. The method of claim 20, wherein irradiating the UV-curable adhesive film with UV light comprises reducing an adhesiveness of the UV-curable adhesive film by at least approximately 90%.

22. The method of claim 20, wherein the carrier substrate is transparent to UV light and irradiating the UV-curable adhesive film with UV light comprises irradiating through the carrier substrate to the UV-curable adhesive film.

23. The method of claim 20, wherein the carrier film comprises polyvinyl chloride and the two adhesive layers are acrylic-based adhesive layers.

24. The method of claim 20, wherein the semiconductor wafer has a thickness approximately in the range of 100-600 microns.

25. The method of claim 20, wherein patterning the mask with the laser scribing process comprises patterning with a femtosecond-based laser scribing process, and wherein etching the semiconductor wafer through the gaps in the patterned mask comprises using a high density plasma etching process.

26. A method of dicing a semiconductor wafer comprising a plurality of integrated circuits, the method comprising:
forming a mask above the semiconductor wafer coupled to a carrier substrate by a UV-curable adhesive film, the mask covering and protecting the integrated circuits;
patterning the mask with a laser scribing process to provide a patterned mask with gaps, exposing regions of the semiconductor wafer between the integrated circuits, wherein patterning the mask with the laser scribing process comprises patterning with a femtosecond-based laser scribing process;
etching the semiconductor wafer through the gaps in the patterned mask to form singulated integrated circuits, wherein etching the semiconductor wafer through the gaps in the patterned mask comprises using a high density plasma etching process;
irradiating the UV-curable adhesive film with ultra-violet (UV) light; and
detaching the singulated integrated circuits from the carrier substrate.

27. The method of claim 26, wherein irradiating the UV-curable adhesive film with UV light comprises reducing an adhesiveness of the UV-curable adhesive film by at least approximately 90%.

28. The method of claim 26, wherein the carrier substrate is transparent to UV light and irradiating the UV-curable adhesive film with UV light comprises irradiating through the carrier substrate to the UV-curable adhesive film.

29. The method of claim 26, wherein the semiconductor wafer has a thickness approximately in the range of 100-600 microns.

* * * * *